(12) United States Patent
Carroll

(10) Patent No.: US 7,519,642 B2
(45) Date of Patent: Apr. 14, 2009

(54) PARALLEL COMPUTATION STRUCTURES TO ENHANCE SIGNAL-QUALITY, USING ARITHMETIC OR STATISTICAL AVERAGING

(76) Inventor: Chester Carroll, 20665 Senator Claude Pepper Dr., Camp Hill, AL (US) 36850

( * ) Notice: Subject to any disclaimer, the term of this patent is extended or adjusted under 35 U.S.C. 154(b) by 0 days.

(21) Appl. No.: 12/144,152

(22) Filed: Jun. 23, 2008

(65) Prior Publication Data

US 2008/0281891 A1 Nov. 13, 2008

Related U.S. Application Data

(63) Continuation-in-part of application No. 11/624,211, filed on Jan. 17, 2007.

(60) Provisional application No. 61/035,175, filed on Mar. 10, 2008.

(51) Int. Cl.
*G06F 7/38* (2006.01)
(52) U.S. Cl. .................................................. 708/445
(58) Field of Classification Search ........................ None
See application file for complete search history.

(56) References Cited

U.S. PATENT DOCUMENTS

| | | | |
|---|---|---|---|
| 5,068,818 A * | 11/1991 | Uramoto et al. | 708/445 |
| 6,512,523 B1 * | 1/2003 | Gross | 345/606 |
| 6,513,054 B1 | 1/2003 | Carroll | |
| 6,618,741 B2 | 9/2003 | Carroll | |
| 7,328,230 B2 * | 2/2008 | Aldrich et al. | 708/445 |
| 7,437,399 B2 * | 10/2008 | Yamashita | 708/445 |

* cited by examiner

*Primary Examiner*—David H Malzahn
(74) *Attorney, Agent, or Firm*—Thomas, Kayden, Horstemeyer & Risley

(57) ABSTRACT

Parallel hardware computation structures for integrated-circuit arithmetic and statistical signal averaging are described herein as an invention that is applicable to broad systems applications where a variety of analog-to-digital and digital-to-analog data interfaces occur. Signal values are improved to accommodate signal reconstruction of high quality and at high frequencies. The computation efficiency of the parallel hardware structures makes them useful in a broad set of applications where signal data is being converted from one electronics domain to another—in particular, from the analog domain to the digital domain and the reverse. Important application areas include video processing, music studios, telecommunications, voice communication and support systems, and information technology in general.

9 Claims, 13 Drawing Sheets

| | | | | | | | | |
|---|---|---|---|---|---|---|---|---|
| $a_{07}$ | $a_{06}$ | $a_{05}$ | $a_{04}$ | $a_{03}$ | $a_{02}$ | $a_{01}$ | $a_{00}$ | "0" Signal Value |
| $a_{17}$ | $a_{16}$ | $a_{15}$ | $a_{14}$ | $a_{13}$ | $a_{12}$ | $a_{11}$ | $a_{10}$ | "1" Signal Value |
| $a_{27}$ | $a_{26}$ | $a_{25}$ | $a_{24}$ | $a_{23}$ | $a_{22}$ | $a_{21}$ | $a_{20}$ | "2" Signal Value |
| $a_{37}$ | $a_{36}$ | $a_{35}$ | $a_{34}$ | $a_{33}$ | $a_{32}$ | $a_{31}$ | $a_{30}$ | "3" Signal Value |
| $a_{47}$ | $a_{46}$ | $a_{45}$ | $a_{44}$ | $a_{43}$ | $a_{42}$ | $a_{41}$ | $a_{40}$ | "4" Signal Value |
| $a_{57}$ | $a_{56}$ | $a_{55}$ | $a_{54}$ | $a_{53}$ | $a_{52}$ | $a_{51}$ | $a_{50}$ | "5" Signal Value |
| $a_{67}$ | $a_{66}$ | $a_{65}$ | $a_{64}$ | $a_{63}$ | $a_{62}$ | $a_{61}$ | $a_{60}$ | "6" Signal Value |
| $a_{77}$ | $a_{76}$ | $a_{75}$ | $a_{74}$ | $a_{73}$ | $a_{72}$ | $a_{71}$ | $a_{70}$ | "7" Signal Value |
| $S_7$ | $S_6$ | $S_5$ | $S_4$ | $S_3$ | $S_2$ | $S_1$ | $S_0$ | "Avg." Signal Value |

| | | |
|---|---|---|
| 700 | | |

| | |
|---|---|
| 10111010110011101010010001101101 | 1st signal value |
| 10111010110011101000010001101101 | 2nd signal value |
| 10111010110011101010010001101101 | 3rd signal value |
| 10111010110011101010010001101101 | 4th signal value |
| 10111010110011101010010001101101 | 5th signal value |
| 10111010110011101010010001101101 | 6th signal value |
| 10111010110011101010010001101101 | 7th signal value |
| 10111010110011101010010001101101 | 8th signal value |
| 10111010110011101010010001101100 | 9th signal value |
| 10111010110011101010010001101101 | 10th signal value |
| 10111010110011101010010001101101 | 11th signal value |
| 10111010110011101010010001101111 | 12th signal value |
| 10111010110011101010010001101001 | 13th signal value |
| 10111010110011101010010001101101 | 14th signal value |
| 10111010110011101010010001101101 | 15th signal value |
| 10111010110011101010010001101111 | 16th signal value |
| 10111010110011101010010001101101 | Avg. signal value 701 |

Figure 7

PARALLEL COMPUTATION STRUCTURES TO ENHANCE SIGNAL-QUALITY, USING ARITHMETIC OR STATISTICAL AVERAGING

CROSS REFERENCE TO RELATED APPLICATIONS

This application is a continuation-in-part of U.S. patent application Ser. No. 11/624,211, filed Jan. 17, 2007, the contents of which are incorporated herein by reference. This application also claims the benefit of U.S. Provisional Application No. 61/035,170, filed on Mar. 10, 2008, the contents of which are incorporated herein by reference.

BACKGROUND OF THE INVENTION

1. Field of the Invention

The present invention relates to parallel-hardware computation structures and more particularly to parallel-hardware computation structures for the purpose of obtaining enhanced-quality measurements of electronic analog signals as they are converted to digital signals.

2. Description of the Related Art

Much of the electronic, telecommunications, aerospace and robotics, medicine, music, electronic domestic systems and automobile and truck industries, all have the essential need for consistent, highly-accurate representations, measurements and processing of analog-to-digital and digital-to-analog signals and data conversions, to provide the interfaces to paths from and to analog and digital information systems. Based on mathematical formulation of a variety of forms, these data boundaries may be traversed by translation of the interface data into different forms to meet system-specific requirements either from analog-to-digital or digital-to-analog forms. Perhaps the more difficult problem is created by the interfaces of analog-to-digital signal boundaries or electronic interfaces, because of the tedious need for precise data-time values to achieve the level of quality specified. When the data is transformed to the analog form, precise digital data is essential to achieve the quality of reconstructed electronic signals needed to meet performance criteria.

The digital electronics domain has numerous advantages over the analog electronics domain, especially in the transmitting of signals accurately and efficiently from one point to another point, or from one electronics environment to another. Signal noise and corruption are much more prevalent in the analog electronics domain. As a consequence, much effort has been devoted to the development of systems to accommodate the conversion of signals from one domain to another and the reverse. Because corruption is possible in the analog electronics domain, methodology is needed to improve the quality of electronically measuring and transferring signals from one domain to another.

The invention presented herein was developed to accommodate the electronic process of measuring signals in the presence of noise and corruption. Since noise, corruption, and other disturbances occur randomly, the averaging of consecutive signal values is effective at minimizing or eliminating the effect of these random occurrences. At this point, the frequency of the measuring becomes important since some uses of the applications for the measured signal values would require that they be obtained efficiently at least twice the frequency of the highest frequency harmonic included in the signal of interest.

BRIEF SUMMARY OF THE INVENTION

An objective of the invention is to provide high-quality enhancements of measured signal values at efficiencies that meet the execution standards and rates of on-chip integrated circuit environments.

One embodiment of the present invention is an integrated circuit design and realization of high frequency, parallel hardware structures for signal-value averaging—either statistical or arithmetic averaging. One embodiment minimizes and/or eliminates incorrect digital values. In some embodiments, it is advantageous to use higher signal-value rates that accommodate high-frequency efficient averaging of consecutive signal values to improve the forming of enhanced quality signals for transmission and signal reconstruction.

One embodiment described here takes signal data values timely, and their accuracy and quality are enhanced by the use of this invention because of its use of parallel hardware structures for high-frequency signal averaging—either using arithmetic or statistical averaging. Embodiments also use Coefficient Polynomial Arithmetic (CPA), and use highly efficient averaging of consecutive signals and prepares the output data in digital form using either ordinary binary or coefficient polynomial form.

The architecture of the parallel structures clearly demonstrates the hardware parallelism and the bit-paths are timed so as to execute totally in parallel. FIGS. 8, 9, and 10 show detailed examples of both the arithmetic and statistical hardware structures, with FIG. 8 depicting the bit-paths and the staging of the organized algorithmic flow through the parallel bit-paths, or parallel hardware paths. The execution balance of the structures allows asynchronous operation to be used for the entire execution through all bit-paths.

An embodiment described herein is designed and realized using parallel hardware structures for the high-performance averaging of signal data values timely and accurately to achieve sufficient quality data for the translation to the digital domain for transmission and then for the translation back to the analog domain. The embodiment enhances integrated circuit application-specific hardware subsystems, such as analog-to-digital conversion design and realization by achieving accurate and timely digital values of sufficient accuracy and quality to provide for signal reconstruction. The embodiment has qualities and advantages that make it useful in a number of electronic design environments to help achieve precise conversion of data from analog-to-digital domains, and more importantly, to make effective on-chip analog-to-digital solutions more directly useful to the chip personalization architect and designer.

BRIEF DESCRIPTION OF THE DRAWINGS

Embodiments of the invention can be more fully understood by reading the subsequent detailed description and examples with references made to the accompanying drawings, wherein:

FIG. 3 is a generalized representation of column registers used to contain the signal values measured in sequence.

FIG. 7 illustrates sixteen 32-bit shift registers being used in processing arithmetic and statistical averaging to achieve higher-quality signal values.

DETAILED DESCRIPTION OF THE INVENTION

Figure 2:
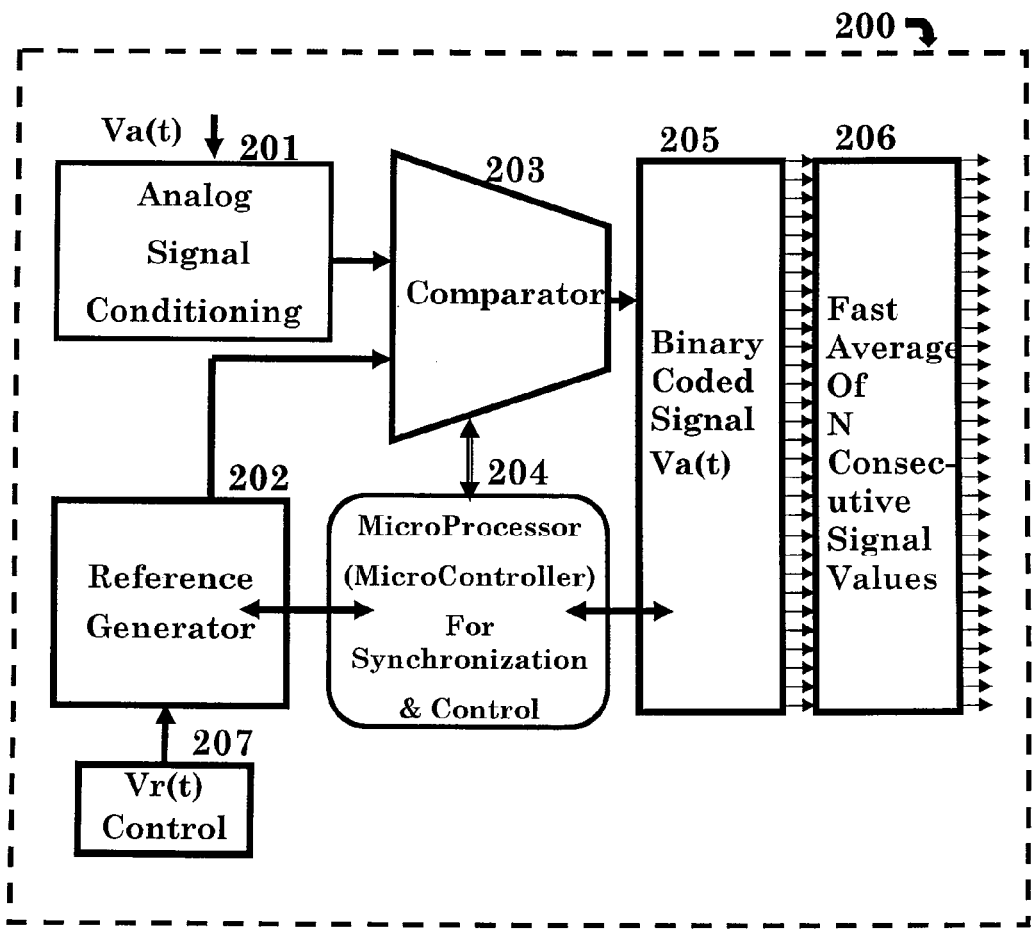
FIG. 2 is a block diagram, which illustrates an application of the fast averaging invention to produce high-quality digital signals in an application of an analog-to-digital converter.

Embodiments of this invention employ Coefficient Polynomial Arithmetic (CPA), to achieve highly parallel hardware structures. These hardware structures execute real-time processing, or computing, to determine the highest quality signal value among 1, 2, 4, 8, 16 and in general N, where N is a power of the numeric base 2, and where N represents the number of separately measured signal values. Embodiments of the invention are particularly useful at data boundaries or interfaces where signal data is being converted from analog-to-digital or digital-to-analog. The hardware structures are also useful at transmission ports to ensure signal quality and at receiving ports to correct for possible corruption before the signal is processed in particular applications. It is also useful in the effective realization of communications systems where high-quality signals are essential in relation to highly effective systems for particular applications. The use of the invention in analog-to-digital converters is shown in FIG. 2 as a means to increase signal quality by efficiently averaging consecutive signal values.

As mentioned above, CPA is used to achieve the efficient flow of arithmetic in the parallel hardware structures. CPA accommodates arithmetic without arithmetic "carries" occurring, unless and until absolutely necessary. When adding with CPA each column of binary bits is simply summed without the carry to the next most significant bit position. The sum of a column of bits becomes a numerical polynomial that represents the coefficient of that part of the resulting addition. This numerical polynomial represents the coefficient of the appropriate power-of-two for that bit position. Note the numerical example of FIG. 4, which shows the complete numerical value of each signal value measured. The sum of each column is expressed using CPA practices, where the set S represents the complete average signal in CPA form. Of course, the set S represents the average signal in CPA form and this form may be converted to ordinary binary form, or it may be used as it is for other arithmetic processes. It may be transmitted in an effort to save time at the sender location and then either be converted to ordinary binary or used in CPA form at the receiver location.

In the realization of convolution as used in a number of systems and methods, the parallel hardware structures can be realized using this invention with application-specific algorithms and processes. For example, embodiments of the invention can be used in the implementation of rate-convolutional encoders, in signal reconstruction, in the determination of signal responses to unit step-functions, and in the use of convolution in general for communication systems realization. In all of these individual cases, a number of signal values are used as data in the calculation of summations, averages and in numeric series summations to achieve summations, averages and reconstructed analog-type signals. The use of the present invention provides a real-time calculation process with high efficiency to produce accurate summations, signal averages, and reconstructed signals.

The implementation hardware is compatible with integrated circuit environments and the entire invention becomes an integral part of the single chip architecture of interest. In applications where improved signal quality is essential, the present invention can be realized within the same integrated circuit environment, as an integral part and with high efficiency. The hardware architecture of the invention does not change significantly as the number of signal values being used changes, according to a binary progression such as 1, 2, 4, 8, . . . , N, where N is the number of signal values needed to achieve the desired signal quality. With an increased frequency of signal-value measurements, the use of fast averaging of N consecutive signal values and the use of CPA improved both the conversion rate and accuracy.

Figure 1:
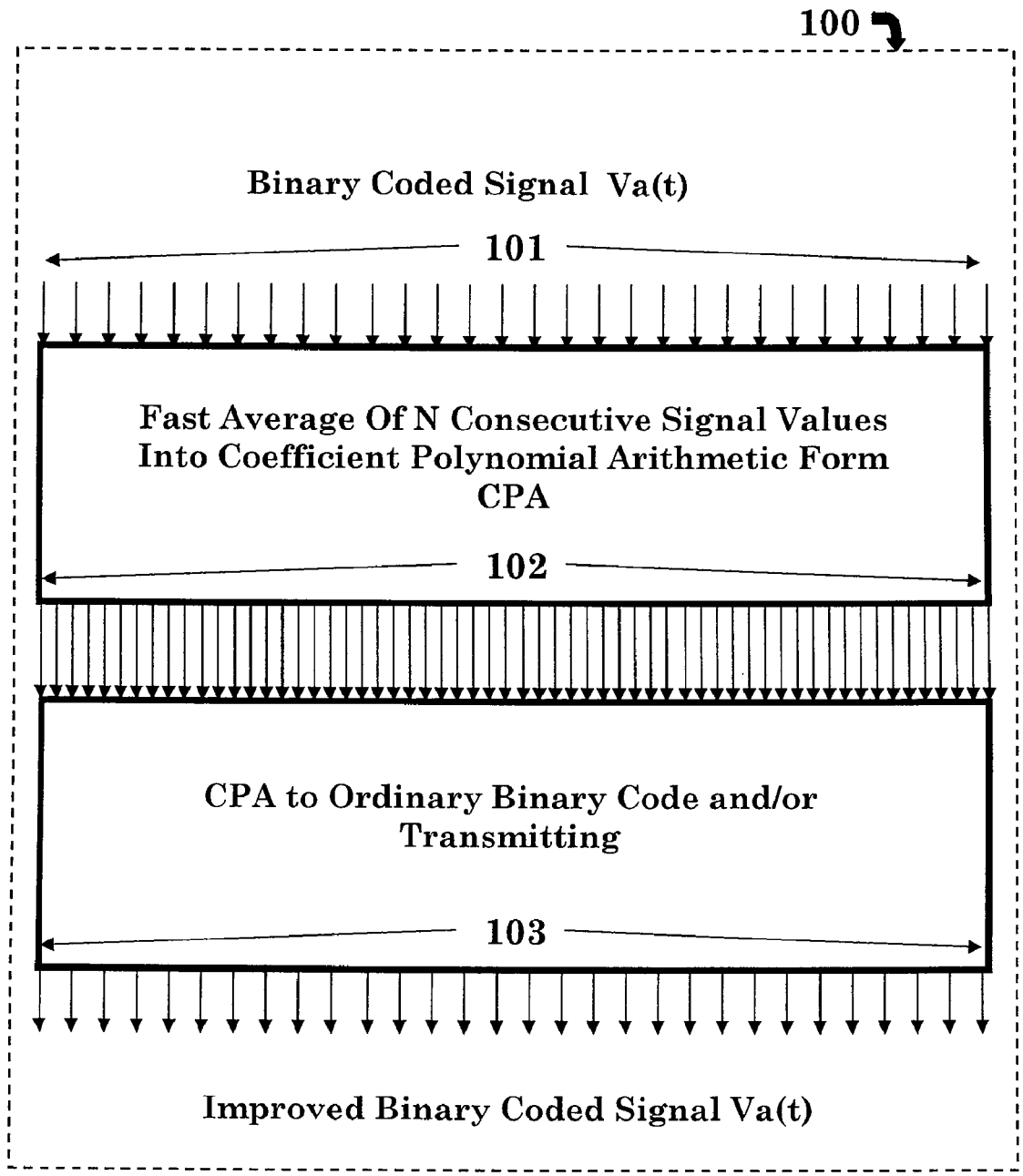
FIG. 1 is a block diagram, which illustrates top-level components of embodiments of the invention.

As shown in FIG. 1 a system 100 is illustrated having three system positions that may be used for flexible hardware architecture in the integration of embodiments of this invention with the system of interest. This demonstrates the flexibility of the invention. Laboratory tests have shown that the invention design is sufficiently flexible so as to provide complete architecture for system-on-a-chip. The three interconnection positions are numbered as 101, 102, and 103. Using the interconnection point 101 provides for the use of raw binary signal values at the output providing Binary Coded Signal Va(t) 101, is the fastest, least accurate of the three different interconnection points. The interconnection point 102 provides the fastest and the most accurate in the CPA format, but the word length is increased by N times at this point. Interconnection 103 is the preferred interconnection point because it is the improved binary coded signal, Va(t). The use of fast averaging of consecutive signal values in combination with CPA demonstrated high-efficiency and high-accuracy with the least word length, since the final signal value is expressed in ordinary binary code. In summary of the flexible interconnection points of the invention, it should be clear that it has desirable architecture for integration with the system of interest on a single chip.

The coarse block diagram of FIG. 1 shows the input of binary coded values of the signal Va(t) and the output labeled 101. These are raw signal values and they have errors and/or inaccuracies that when transmitted and/or used for signal reconstruction cause errors in the reconstructed signal. Using multiple, consecutive signal values provide computing opportunities to produce an immediate arithmetic average-value, within the parameters of the system of interest, over N signal values or an immediate bit-by-bit statistical value over the same N signals.

Embodiments of this invention are important in their relationship to the processing of signals in a number of signal and system domains where high-efficiency and high-accuracy are essential. The parallel hardware structures are designed and realized to accomplish high-quality signals from raw signals, and to meet the time constraints necessary in higher-frequency systems. An example is element 102 of the block diagram of FIG. 1, where the fast average of N consecutive signal values is available in CPA form. The signal may be transmitted from this interconnection point to achieve efficient availability for transmission to a remote receiving environment. The signal at this point can be readily used to represent the improved signal in CPA form, or it may be converted to ordinary binary form to represent the improved signal, and then transmitted 103 as the Improved Binary Coded Signal Va(t). The hardware architecture of the system of interest is provided considerable flexibility with the interconnection locations.

FIG. 2 shows an example application using an embodiment of the invention to improve the signal values of an analog-to-digital converter 200. This analog-to-digital converter uses analog signal conditioning 201 of Va(t). In analog-to-digital conversion it is generally not sufficient to just simply use the periodic, raw signal values as the final results of the analog-to-digital conversion process. Where high-accuracy is desired, such as when using the analog-to-digital converter 200 shown in FIG. 2, the average of multiple signal values shown as Binary Coded Signal Va(t) 205 and the Fast Average of N Consecutive Signal Values 206 may be used to achieve increased accuracy.

The frequency at which the signal values are taken may be increased to allow for the time delay or latency created by the averaging process. The conversion process uses a reference generator 202 and a Vr(t) Control 207. The Micro-Controller 204 provides the synchronization of the Reference Generator and the clock of the Binary Coded Signal Va(t) 205. The Comparator 203, signals that the values of Va(t) 201 and the reference Vr(t) 202 are equal within the resolution of the Comparator. The efficiency of the averaging process is therefore of interest.

Embodiments of the invention utilize parallel bit-paths and use these bit-paths to achieve analytical parallelism in the totally parallel hardware structures for either arithmetic or statistical execution. A bit-path is the hardware path that a single bit stream takes through the hardware architecture. Independent, parallel bit-paths provide a totally parallel architecture. The efficiency of the hardware is directly related to the degree of total bit-paths existing in the complete architecture. Using CPA provides for increased hardware parallelism throughout the architecture where there is defined reluctance to perform arithmetic carry operations unless it is mandatory. The coefficient polynomials accurately represent the current results existing at any phase of the process being executed with the architecture at the time.

FIGS. 3 through 10 show examples of the hardware bit-paths and the following paragraphs include a discussion of the arithmetic bit-flow through the parallel hardware paths. This is accomplished using the example values of 400 and 401 of FIG. 4, which shows the column arithmetic and the counter register values for each column. The counter register values are determined by simply adding the respective column values to determine a numerical polynomial, with the only carries being the carries associated with a single column summation—which may be accomplished by simply counting the number of 1 bits in each of the single columns. Some hardware architectures for counting a single-bit column do not require a carry to be propagated. The respective polynomials are then used to determine the correct bit for the respective column. Without the error of the raw signals, the column should be either all "0's" or all "1's" since the column represents the values of a single bit position in all signal values shown. When all correction has been achieved, the coefficient polynomials should be either, 0000 or 1000.

An example of the basic architecture of an embodiment of this invention and the design realization of the arithmetic structures of the invention are both shown in FIG. 3 300. Eight shift-registers are shown together for storage and processing of eight raw signal values. These signal values are to be processed by the invention hardware to achieve the average of the eight signal values represented with a resolution of eight bits. This average signal 301 is then stored in the register using CPA to represent the eight elements of the set S, which represents the average signal value. This average value is available at an interconnection point 102 in CPA form. The set S 301 represents the arithmetic result of summing, or counting, each of the columns individually, using CPA rules, and producing the eight individual elements of S. It is of interest to note that these columns are summed in totally separate hardware bit-paths and the results are stored in totally parallel sub-registers, each of which represents an element of S 301.

Figure 4:
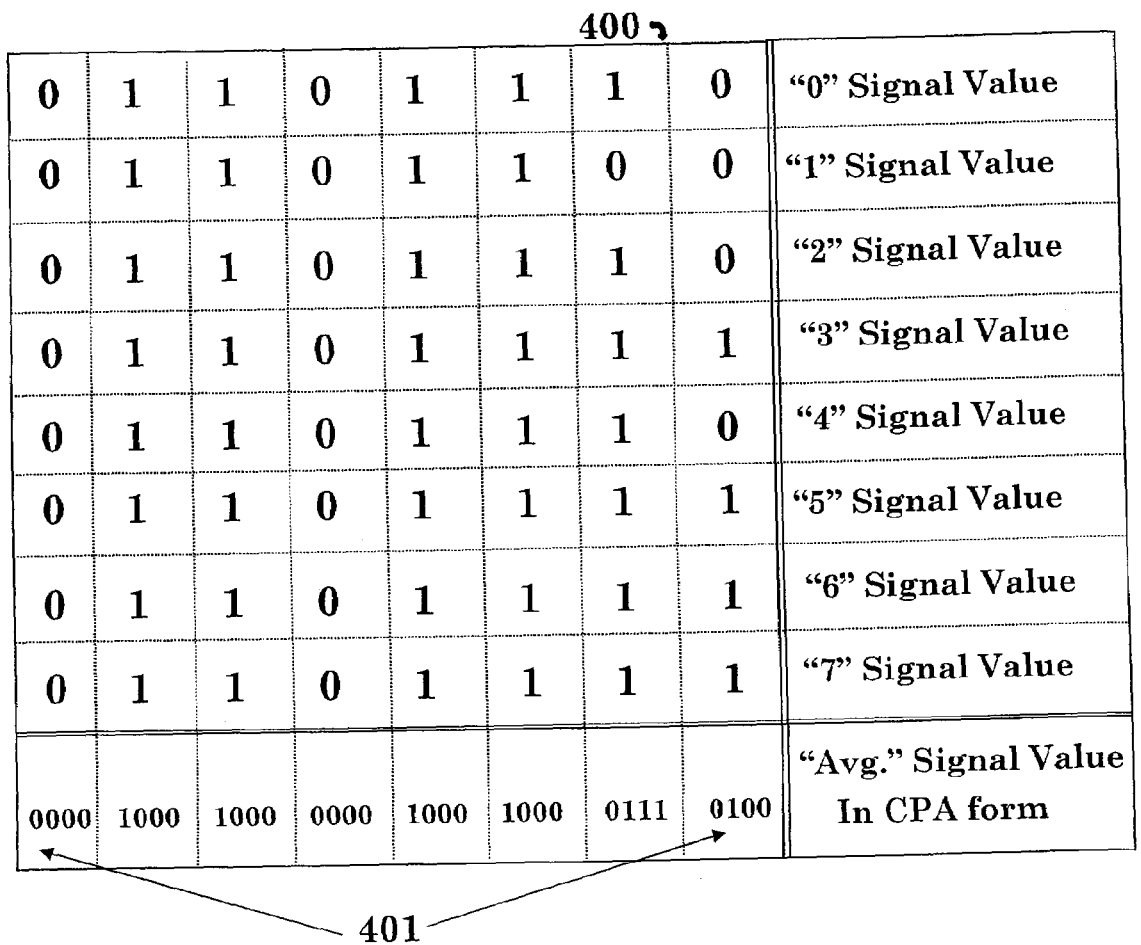
FIG. 4 is a block diagram similar to FIG. 5, but illustrating a numerical example.

FIG. 4 illustrates a numeric example 400 of bits and signals as specific values for the general hardware of FIG. 3. It should be noted that there are eight consecutive signal values each represented by eight bits, and an output register 401 for the average signal. The register is made-up of eight sub-registers of four-bits each, representing the eight elements of the set, S 401. Each of these eight registers represents the sum of the "1" bits in corresponding register segments of the eight signal-value registers 401. The 4-bit content values are simply the count of the number of 1-bits in the corresponding bit positions of the eight signal-values. It should be noted that the Set S 400, precisely represents the average signal value 401 and that the CPA form may be utilized to completely represent either the arithmetic of statistical average signal value. It may be transmitted from the second interconnection point 102 or it may be converted to ordinary binary form and transmitted from the third interconnection point 103. The corrected transmission in CPA form would be S=(0000, 1000, 1000, 0000, 1000, 1000, 1000, 1000). Transmission in binary form for the corrected signal, would be 01101111. The corrected value assumes the interpretation of "1" when there is a majority of "1's" or when the number of "1's" is at least the number specified in the rule.

Both forms of the average signal are useful, with the transmission in CPA form being available earlier than the ordinary binary form. Also, if the CPA form is used and is transmitted from interconnection point II, it may minimize the transmission time constraints, even though the word-length would be increased by four times. At times, it is more convenient to convert from CPA form to binary form at the sending sight, even within the hardware structures of the system of interest. In some applications it is more convenient to transmit in CPA from the sending site and convert from CPA form at the receiving site. Furthermore, if the CPA form 102 is more efficient in merging signal values, or data, at the receiving end where the signal values are actually used to reconstruct an analog signal or some other application—conversion would probably be more advantageous at the receiving end.

Figure 5:
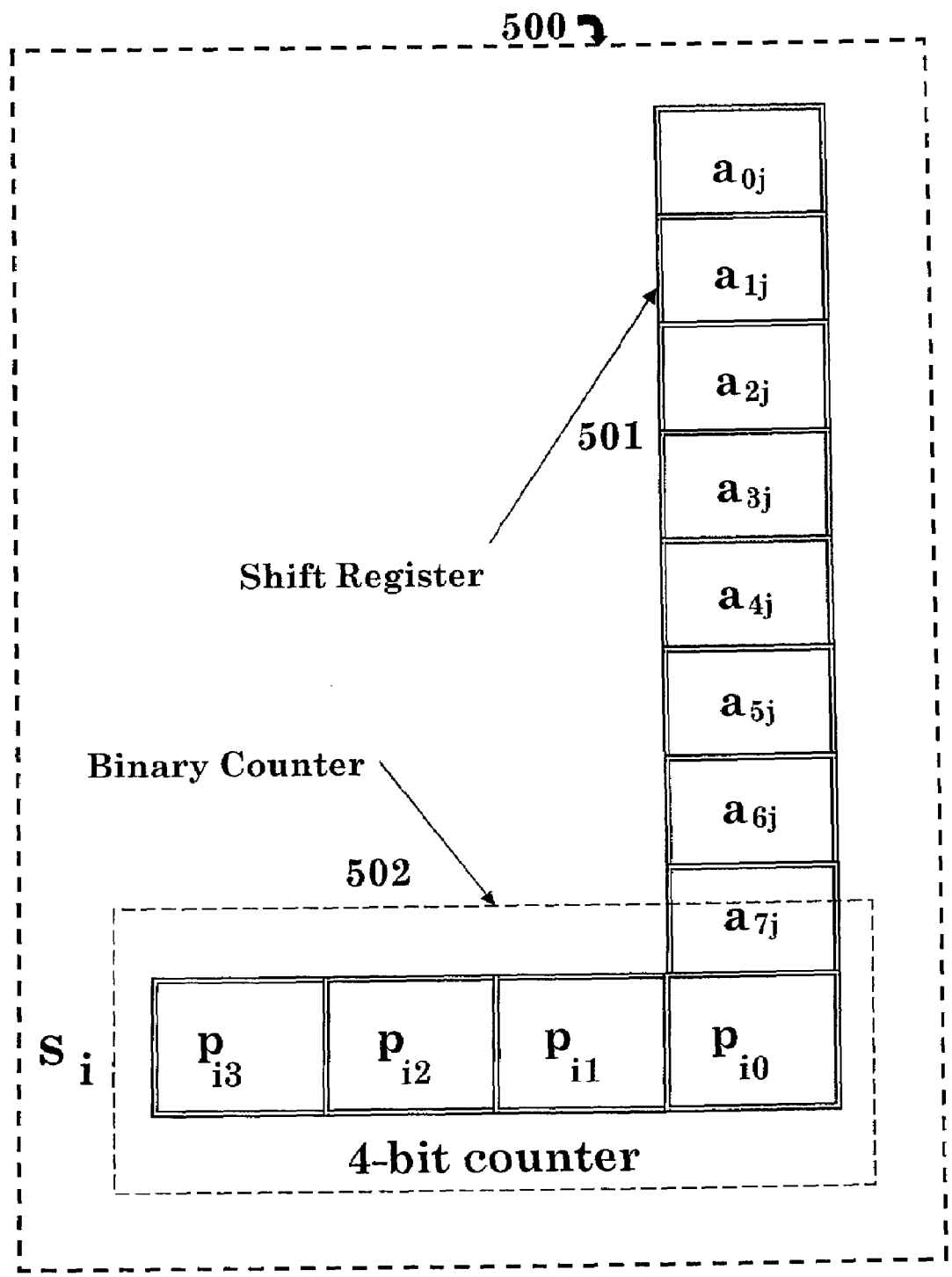
FIG. 5 illustrates the use of example hardware components, an eight element shift register and a four element counter making-up the summation hardware for the signal values stored in the column registers.

In FIG. 5, the column register 501 is a single column, as shown, that represents the corresponding bit positions and values stored in an eight element shift register 501. Also shown, the counter 502 is a four-position, four-bit counter representing the sum of the 1-bits in the corresponding column shown. The corresponding element of S is represented by the four-bit register of the counter 502. The entire counter register S represents the CPA form of the corresponding bit position of the eight signal values measured for either the arithmetic or statistical averaging to achieve the average of the eight measured signals.

It should be appreciated that this hardware, for a given bit position, is totally independent at this stage of the averaging process, and the averaging of all positions may be executed in totally parallel fashion—they are parallel hardware structures and the set S 300 of them may be used to represent the average signal value just as accurately as the ordinary binary form. Since the hardware structure includes these parallel "bit-paths," the implementation architecture is realized with identical hardware in each of the bit-paths and there are no "cross-overs" required from one bit-path to another. The chip surface area and the timing make the realization architecture more modular and it increases the asynchronous nature of the final architecture operation and execution.

Figure 6:
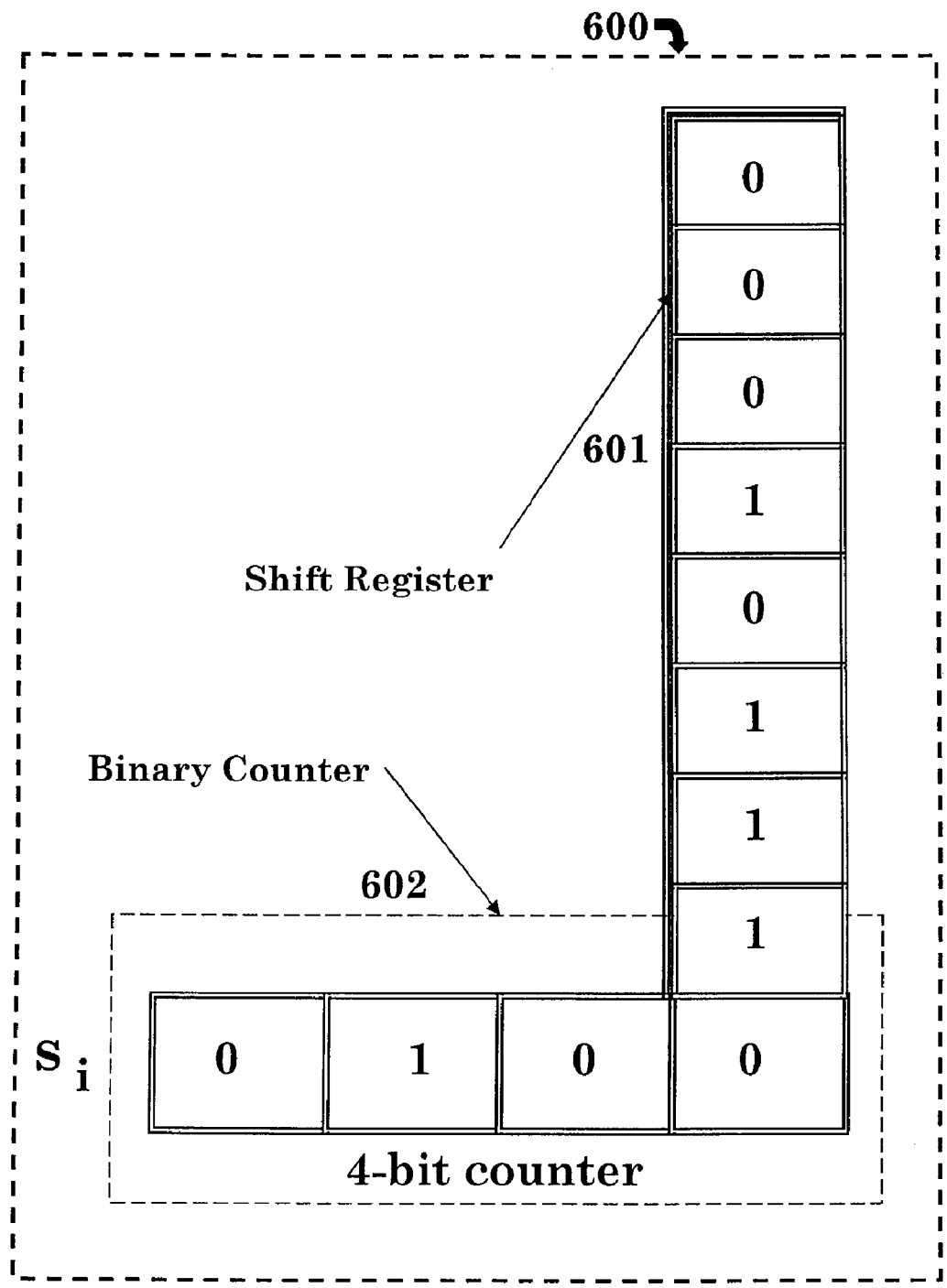
FIG. 6 is a diagram similar to FIG. 5, providing a numerical example to illustrate the operation of the circuitry, with a four element counter to sum the eight-bit column.

The utilization of the parallel computation structures of the invention are generously enhanced by the inherent parallelism in the use of CPA methods, where feasible. An example is shown in FIG. 6, showing a structure 600 with signal value contents in the corresponding column register elements 601 and the sum of the 1-bits shown in the counter register 602 for the corresponding elements of the set, S, representing the CPA value of the average signal value. The column register of course represents the same bit position for each of the signal values measured for the averaging process.

FIG. 7 is an example 700 using a larger number of signal values measured for the averaging process and each of them is represented with a larger number of bits. This example illustrates an example that is relatively more difficult in terms of the size of the architecture and the hardware structures needed to realize it. This could be more taxing if not for the use of CPA methods. The example shows the calculation for the averaging of sixteen signal-values, each of thirty-two bits in length. The average value 701 is shown of course in thirty-two bits. Using the parallel hardware structures of this invention produces the result in the average signal-value register as the corrected signal value, represented by thirty-two bits. Then, if the error margin is three bits per column in FIG. 7, the coefficient polynomials are used to correct positions 13, 14, 15, and 16 to the values 10000, 10000, 00000, and 10000.

The correct bit values for each of these positions is determined totally in parallel by a set of two-level logic circuits with the identical circuit at each position. For the example of 700, the logic function is F(A, B, C, D) 903 in FIG. 9, for the average signal value 701 of FIG. 7, since it is equal to the binary count of the "1s" in the common position of the signal values. If a simple majority of nine "1s" is recognized as a position "1" bit, then the function is F=m(8,9,10,11,12,13,14,15), which of course may be reduced considerably to make the logic function simple—and it is the same function for all positions.

Figure 8:
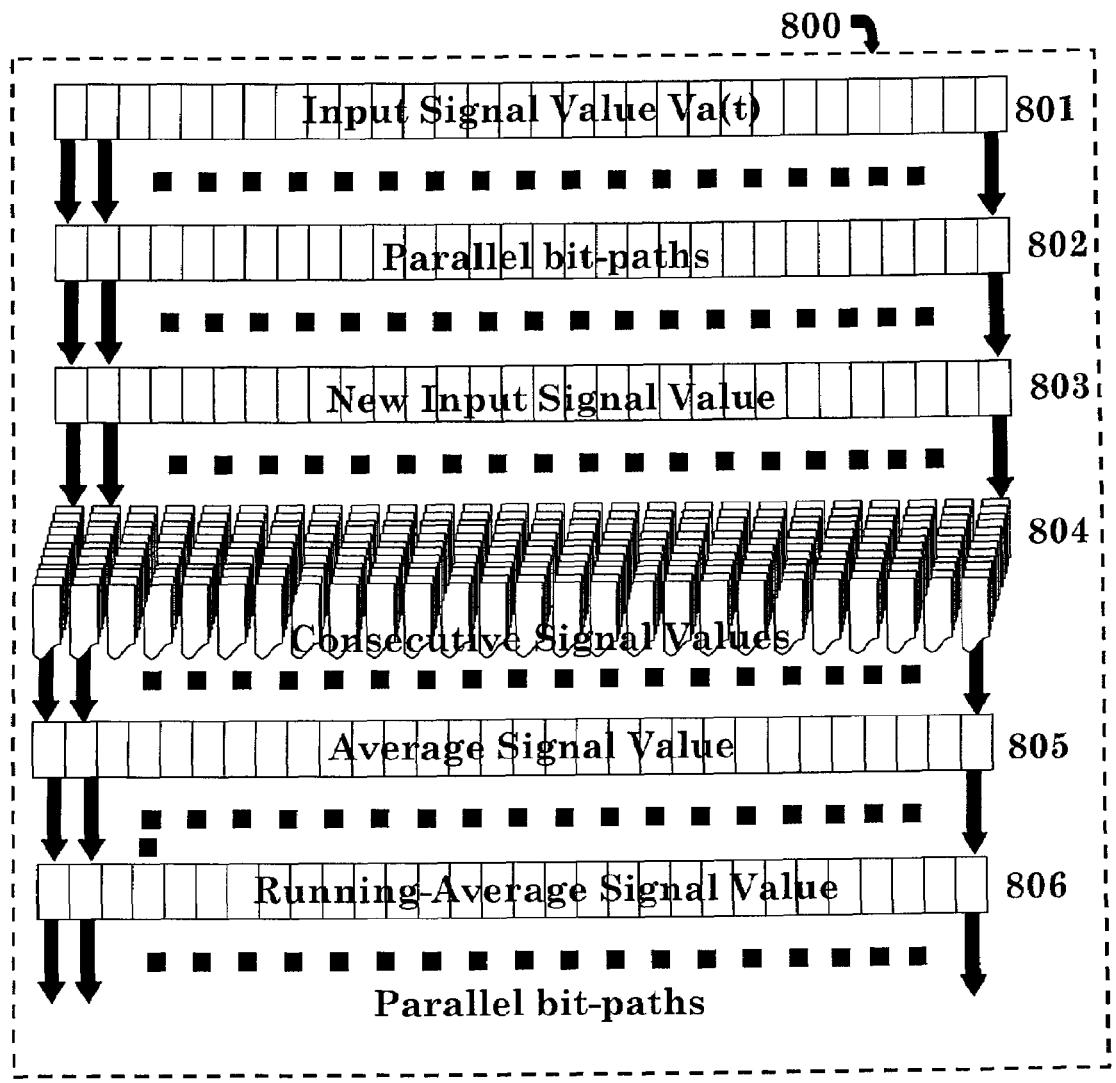
FIG. 8 is a diagram illustrating bit-paths and certain levels of functionality achieved by the parallel hardware structures.

An embodiment of the invention includes the parallel hardware structures 800, shown in FIG. 8, for computing the average, or the running-statistical-average 806, of sixteen consecutive signal values 804, each represented by thirty-two bits 801. The statistical average is determined by obtaining the statistical average in each corresponding bit position of the sixteen signal values 701. There are of course sixteen of the signal values being used for each single average signal value 805, or for each averaging leading to a running average 806 of the signal value. In FIG. 8 all registers 800 for the sixteen signal values represented by thirty-two bits each, are to be statistically averaged by computing the correct value for each bit position of the final resulting average signal value, as shown in the example of FIG. 7.

The thirty-two logic circuits 800 shown in FIG. 8 are identical except for the end positions for each of the thirty-two bit positions 801 through 806. Each bit position simply represents the logic value of the number of 1-bits required in each column to "specify" that the corresponding position value of the improved signal is a "1" or a "0." For example, the minimum of nine of the sixteen bit values would be a "1" for a "1" to be recorded as the correct bit value for the corresponding bit position on the average signal. In general, the logic circuit 903 for each position would specify a "1" for a simple majority of the corresponding bit positions having a "1" value, and a "0" for a simple majority of the corresponding bit positions having a "0" value.

With regard to FIG. 8, it should be appreciated that the drawing is presented for illustration purposes, and not all details are expressly shown, but will be appreciated by persons skilled in the art. For example, the figure is presented to illustrate thirty-two parallel bit paths, and it will be understood that there are thirty-two parallel bit paths, even though fewer may be specifically illustrated in the drawing, due to space limitations on the drawing sheet).

With an error margin of three bits per column, the correct bit value for each column is determined for each position totally in parallel by a simple two-level logic circuit at each position. The set of coefficient polynomials shows the four uncorrected bit positions. Using the two-level logic circuits shown, the asynchronous parallel correction yields the correct bit values for positions 13, 14, 15, and 16 to the values 10000, 10000, 00000 and 10000, respectively.

Figure 9:
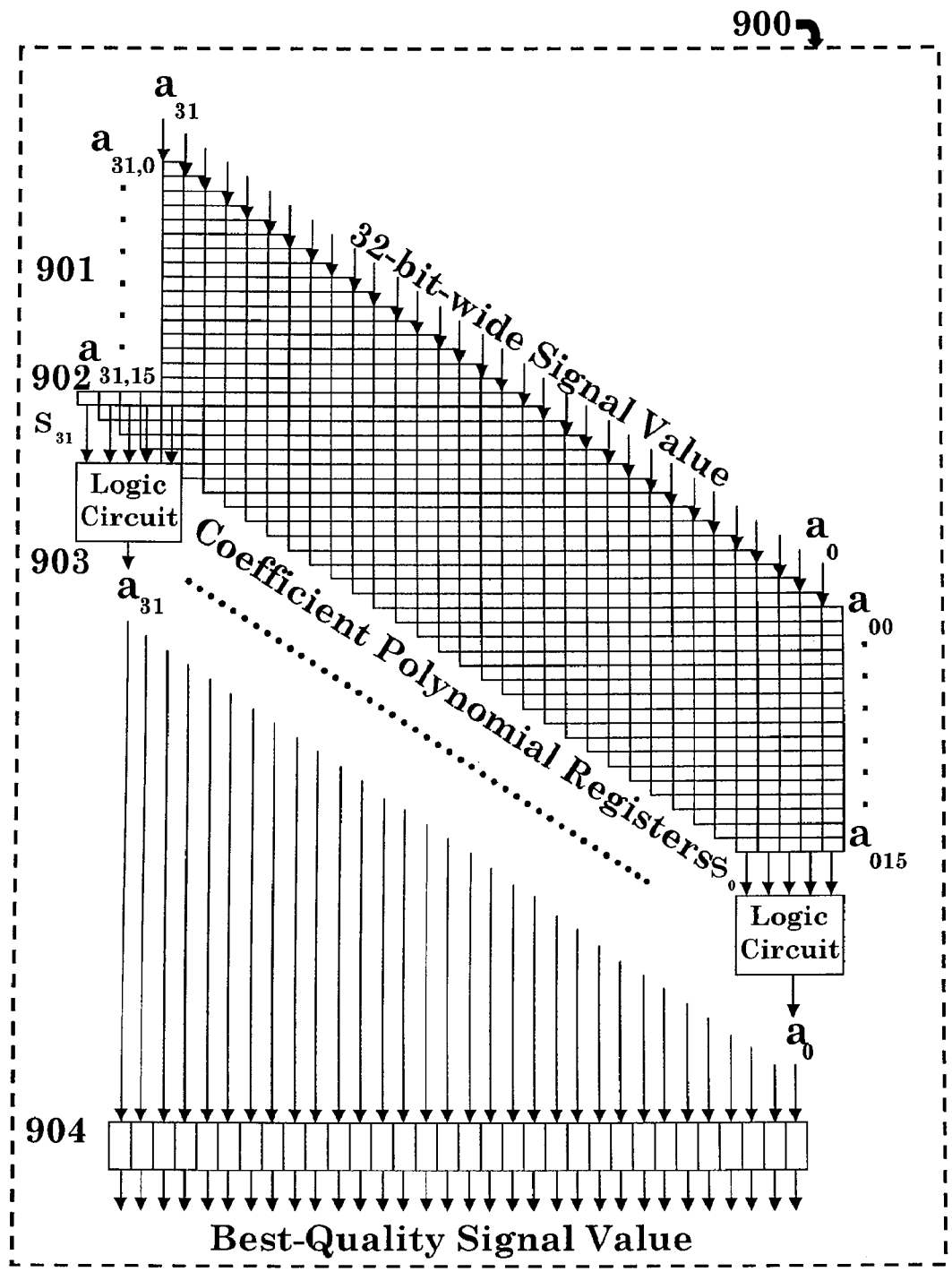
FIG. 9 shows an array of shift registers and counters for each column complete with a two-level logic circuit at each of the thirty-two bit positions to provide the automatic correction of the entire signal value.

As illustrated in FIG. 8 and shown in FIG. 9, the parallel bit-paths 901, 902, 903 and 904 execute the required functionality in a totally parallel fashion without cross-overs from one bit-path to another. Even the logic function of each position is within the bit-path and is executed asynchronously with the entire bit-path. Because of this parallelism, the parallel structures execute efficiently. Because CPA is being used, the counter-register 902 has sufficient information to provide the logic circuit 903 with the values to produce the correct logic output to correct the bit position as needed. The bit-paths have executed in totally parallel fashion. The entire hardware structure of FIG. 9 900 computes the correct value of the statistical average of the sixteen signal values.

The parallel hardware structures 900 of FIG. 9 demonstrate the least computation time and are therefore more efficient in computing the best average of the signal value, arithmetic or statistical average. These hardware structures examine each bit position of all the signal values and compute the best for each bit position, as well as the average signal value. The hardware architecture of the complete parallel structure is accomplished to be compatible with current realization environments and to require minimum integrated circuit surface area. The structures are useful in systems on a chip concepts and practices because of their uniformity, timing requirements and their minimum time-depth requirements.

Figure 10:
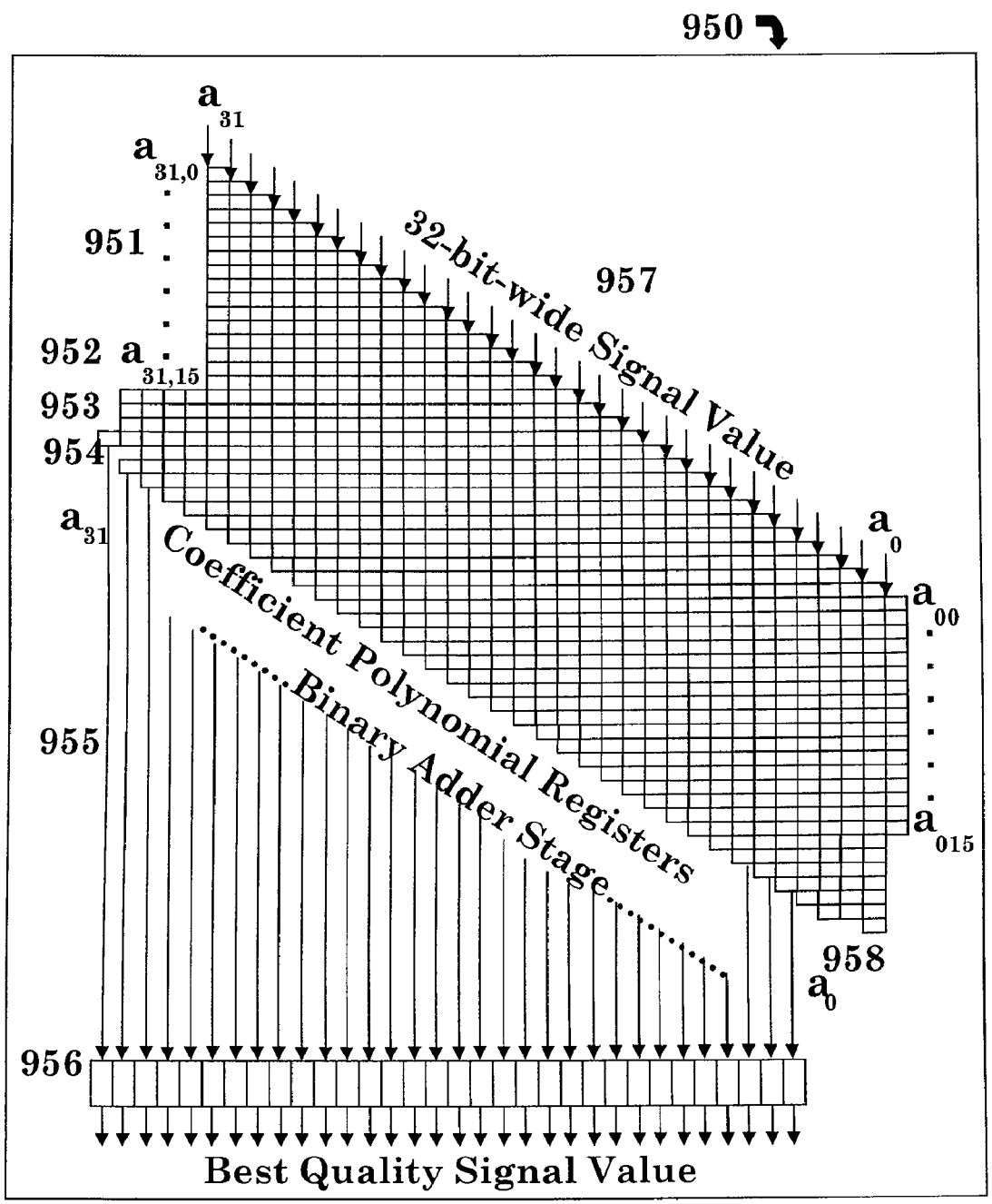
FIG. 10 shows the parallel hardware structures that are used to achieve the arithmetic average of the sixteen, thirty-two bit signal-values, in accordance with one embodiment of the invention, which includes a final addition stage to produce the corrected signal value.

Parallel hardware structures 950 are shown in FIG. 10 to compute the arithmetic average of sixteen thirty-two bit signal values 951. Coefficient Polynomial Arithmetic is used with registers 952 through 954 to produce the hardware architecture for the total parallelism that is achieved by the structures 950. It is noted that each parallel path is formed of the same hardware architecture shown in FIGS. 3 through 7, and uses the column register and counter register for each bit position. The column registers are summed and the corresponding bit-sum is accumulated in the counter register for each column register. The over-lapping five-bit counter registers create the second phase of the parallel merging with the set of column registers shown varying in height from a single-bit height, up to a height of five-bits. The third phase is created by the up-to-three-bit registers that form the columns, of height up-to-three bits. The last phase is formed by the two-bit counter registers, whose values are used as the inputs to a full binary adder, which produces the sum as the best-quality signal value.

To achieve the average arithmetic signal value using division by sixteen, 10000 in binary, is accomplished by simply moving the binary point five places to the left and ignoring the five least-significant bits. It is, of course, not necessary to include the hardware for the final processing of these five bits. The five least-significant bits would be shifted out of the registers.

Since these different applications have individual requirements, the invention has been designed, prototyped and described to accommodate appropriate claims related to the invention that are application specific. Unlike other known designs that use sampled-data principles and practices alone, the invention in addition uses increased frequencies and periodic data measuring. At very specific time intervals, it employs highly efficient averaging of consecutive signal values.

Embodiments of the invention achieve higher quality and smoother analog signals following the reconstruction process. And, because the embodiments include highly-efficient signal averaging and the flexibility to transmit the signal values in either ordinary binary form or coefficient polynomial form, higher-quality signals may be reconstructed with the use of either ordinary binary or coefficient polynomial form.

Figure 11:
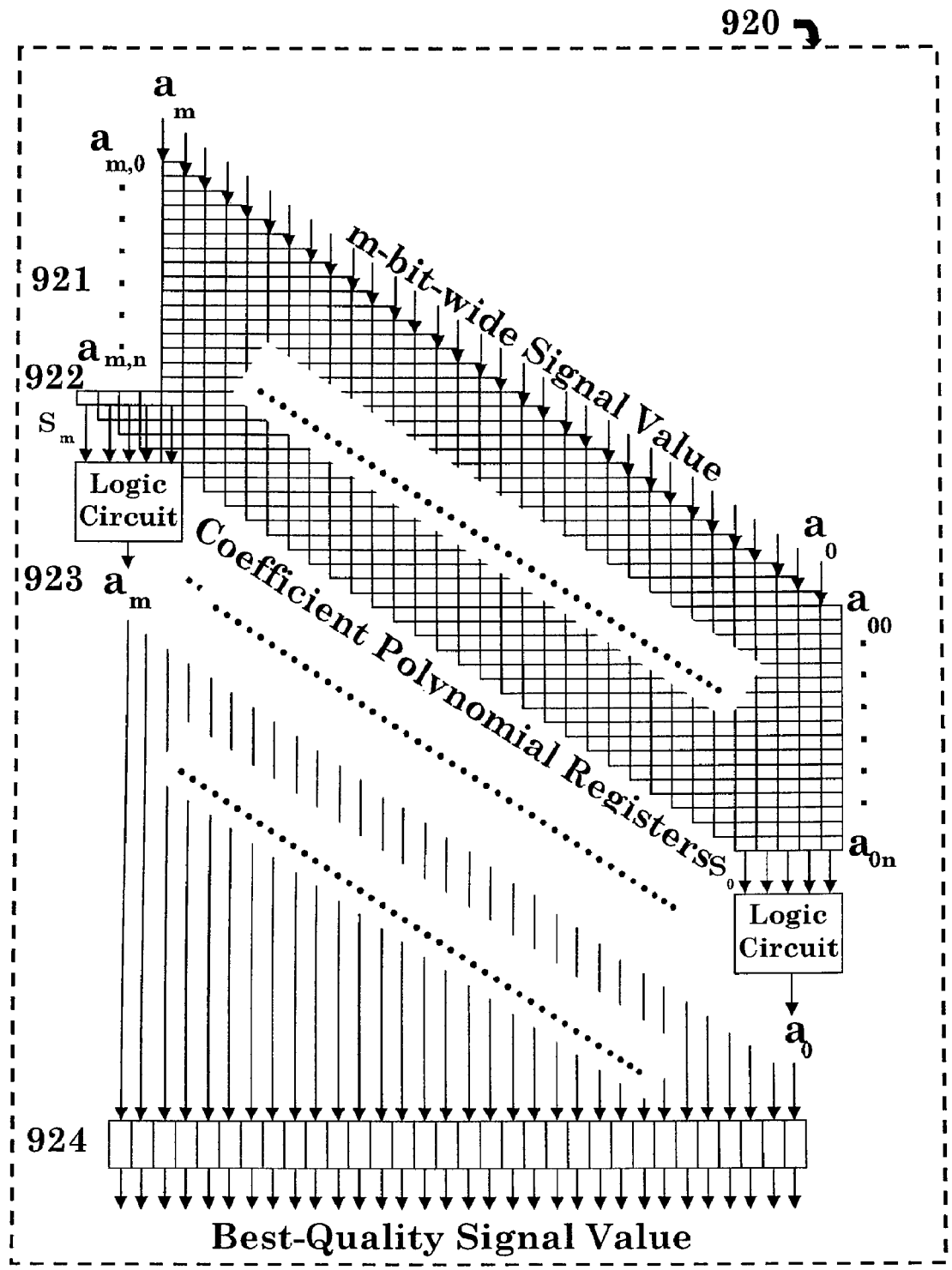
FIG. 11 illustrates a generalized architectural structure showing variable dimensions for bit-paths and registers for the statistical averaging and the running-averaging of "n" signal values of length "m."

Therefore, the preferred embodiment is presented in FIG. 11, 920 as the generalized graphical specification of parallel computation structures to calculate the "Best-Quality Signal Value" of binary length "m." The number of signal values used is represented by "n" and the binary bit-length of each signal value is "m." The number of cells in the column register 921 is "n" and the number of cells in the counter register 922 is the length of the coefficient polynomial needed to represent the sum of the column and therefore the number of inputs of each of the "m" two-level logic circuits. Computing the coefficient polynomials by counting the 1's in each of the columns as mentioned above can be used to determine the logic functions to correct each bit separately for the average signal value.

The preferred embodiment is presented in FIG. 11, 920 as the generalized graphical specification of parallel computation structures to compute, or calculate, the "Best-quality Signal Value" of binary length "m." The number of signal values used is represented by "n" and the binary bit-length of each signal value is "m." The number of cells in the column register 921 is "n" and the number of cells in the counter register 922 is the length of the coefficient polynomial needed to represent the sum of the column and therefore the number of inputs of each of the "m" two-level logic circuits.

The preferred embodiment includes the parallel hardware structure 920 as shown in FIG. 11 with "m" parallel bit-paths, with column registers 921 of length "n" and with "m" logic circuits 923 to correct the "m" bit positions of the signal values. It includes "m" counter registers 922 to provide the sum of the respective "m" columns 921 and to provide the inputs to the "m" logic circuits 923. The "m-bit" length, best-quality signal values are calculated from the "m" parallel bit-paths that form the hardware architecture of the entire parallel structure. The architecture 920 accepts either a continuous or a periodic flow of "n" measured signal values 921 inputs of length "m" and is clocked to produce periodic average signal values 924 based upon the statistical average of "n" signal values.

The structure 920 is asynchronous in that once information representing the current signal value in the form of "m" bits, is clocked into the initial "m" register, the oldest signal value is clocked from the structure 923. The clock frequency determines the frequency of the "best-quality signal value." The output signal 924 is therefore either a current-average signal value or a running-average signal value, depending on the clock frequency and the timing of the "n" signal values being actively processed in the parallel bit-paths of the entire hardware structure 920.

Therefore, the preferred embodiment includes both the current-signal value average 924 and the running-average of the signal value 924 as determined by the clock for the 920 hardware architecture and structure 921 of FIG. 11.

AN ALTERNATIVE EMBODIMENT

Figure 12:
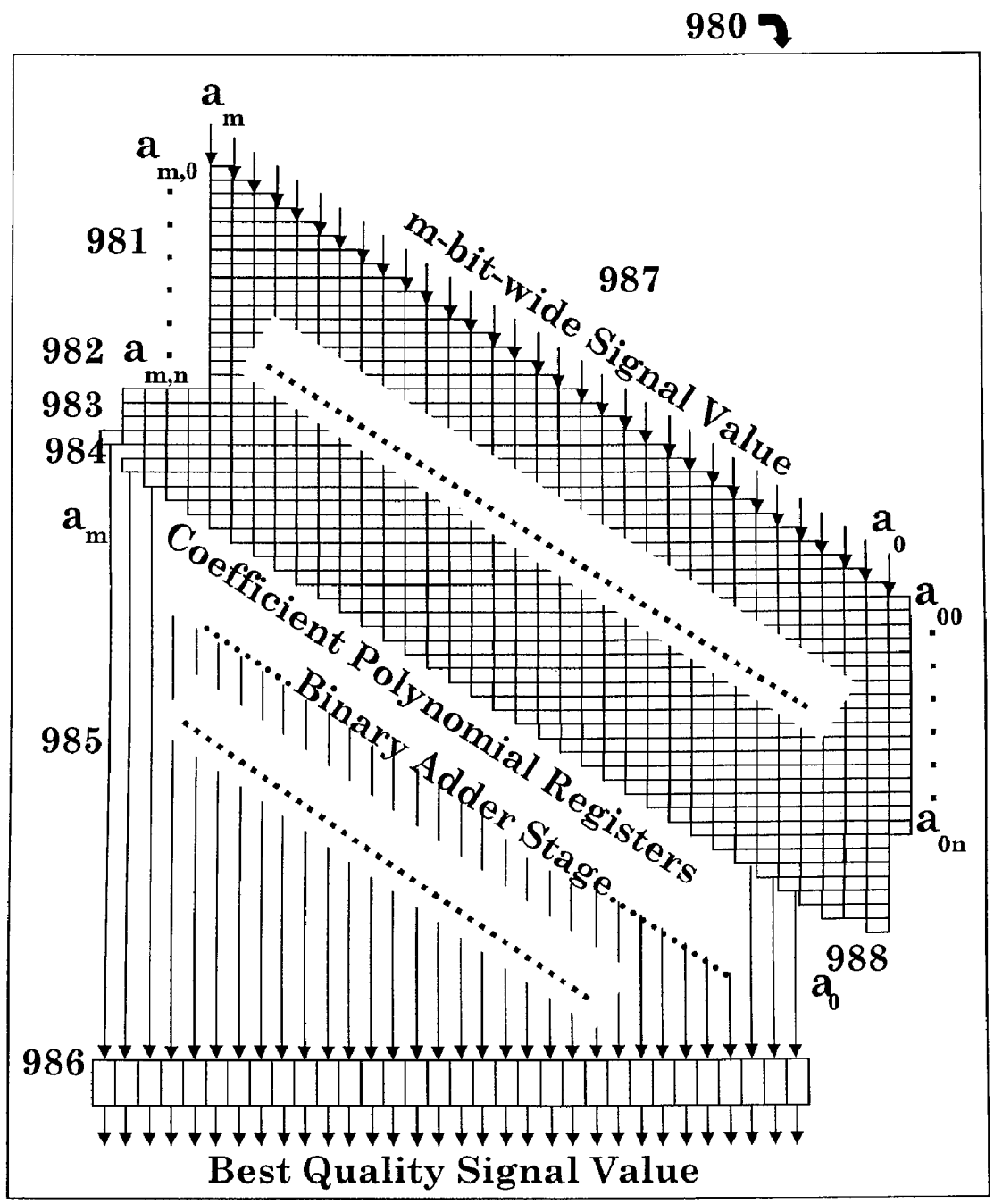
FIG. 12 is a diagram illustrating arithmetic averaging of "n" signal values of length "m" with their running average being shown in the hardware architecture.

On alternative embodiment, illustrated in FIG. 12, uses parallel arithmetic computing structures 980 to enhance signal-quality in a generalized form, with the capability of computing the arithmetic average of "n" signal values of length "m." Either column-by-column statistical averaging or complete arithmetic averaging is successful when they are used to determine the best-quality signal-value. This alternative embodiment is presented in the text below and includes the entire graphical structure 980 shown as FIG. 12. This part of the embodiment includes all of the examples presented in the previous graphical structures of this document and including the hardware architecture and structure of FIG. 12.

Also, as shown in the hardware structure 982, 983, and 984, using complete arithmetic averaging for the "n" samples can be accomplished using CPA in three levels: 1) a first-level to achieve a set of five-element polynomials; 2) a second-level to achieve a set of three-element polynomials; and then a full adder stage to complete the arithmetic average of all sixteen signal values represented in thirty-two bit-lengths.

The drawing of FIG. 12 is illustrated in a left-to-right, downward sloping angle only for the purpose of representing a possible, general layout of cells on a chip. As a column of cells and corresponding counter generally form a reverse "L" shape, laying out the cells in a general angle, as illustrated, may result in a more compact and efficient chip layout. The appearance, as show in the figure, however, has no impact on the functional operation of the circuit.

Arithmetic averaging of signal values is the primary function of the hardware architectural structure 980. The overall purpose of the hardware structure is to determine the best-quality signal value by computing the average signal value using arithmetic methods. The parallel computing hardware structures of this invention are to be used to calculate on a real-time basis, the arithmetic average on a periodic basis and on a running-average basis.

Therefore, the parallel hardware structures 980 as presented in FIG. 12, represent the generalized graphical specification of parallel computation structures to arithmetically calculate the "Best-Quality Signal Value" of binary length "m." The number of signal values used is represented by "n" and the binary bit-length of each signal value is "m." The number of cells in the column register 981 is "n" and the number of cells in the counter register 982 is the length of the polynomial needed to represent the sum of the column.

The graphical overlapping of the counter registers 982, 983, 984 and 988, forms the next reduced-length column registers that are to be summed and the value placed in the subsequent counter registers. Coefficient Polynomial Arithmetic, CPA, is used to avoid uncontrolled over-lapping of the information flowing through the column and counter registers. In this way the parallelism of the bit-paths may be maintained and the overall flow of the arithmetic is aided by the parallelism of the entire CPA process.

This includes the parallel hardware structure 980 with "m" parallel bit-paths and "m" column registers 981 of length "n." It includes "m" counter registers 982 to provide the sum of the respective "m" columns 981 and to provide the inputs which form the second phase of the CPA methodology with the overlapping counter registers 983. Then, the next phase of the CPA process produces the counter registers of the reduced-length counter registers 984. This process continues until the counter registers are of length two, which provide the inputs to the parallel connected binary counter that adds to produce the final arithmetic output of the average signal value in register 986. Dividing by the number of signal-values "n" to produce the final arithmetic average is achieved by simply ignoring, rounding-off, the right-most bits, which are the least significant bits not included in the m-bit length of the final arithmetic-average signal-value or the running-average signal-value.

The "m-bits" length best-quality signal values are calculated from the "m" parallel bit-paths that form the hardware architecture of the entire parallel structure. The structure 920 accepts either a continuous or a periodic flow of "n" measured signal values 921 as inputs of length "m." The structure is clocked to produce periodic average signal values 924 based upon the statistical average of "n" signal values.

The structure 980 is asynchronous in that once the information representing the current signal value in the form of "m" bits is clocked into the initial "m-bit" register, the oldest signal value is clocked from the structure 986. The clock frequency determines the frequency of the best-quality signal value. The output signal 986 is therefore either a current-average signal value or a running-average signal value, depending on the clock frequency and the timing of the "n" signal values actively being processed in the parallel bit-paths of the entire hardware structure 980.

The relative success of the use of arithmetic structures of parallel bit-paths that execute completely in parallel, is determined by the degree of parallelism achieved overall. Also, using complete arithmetic averaging for the sixteen samples can be accomplished using CPA within three levels:

1) first-level to achieve a set of five-element polynomials;
2) second-level to achieve a set of three-element polynomials; and then,
3) full adder stage to complete the arithmetic average of all sixteen signal-values represented by thirty-two bits in length.

Another Alternative Embodiment

Figure 13:
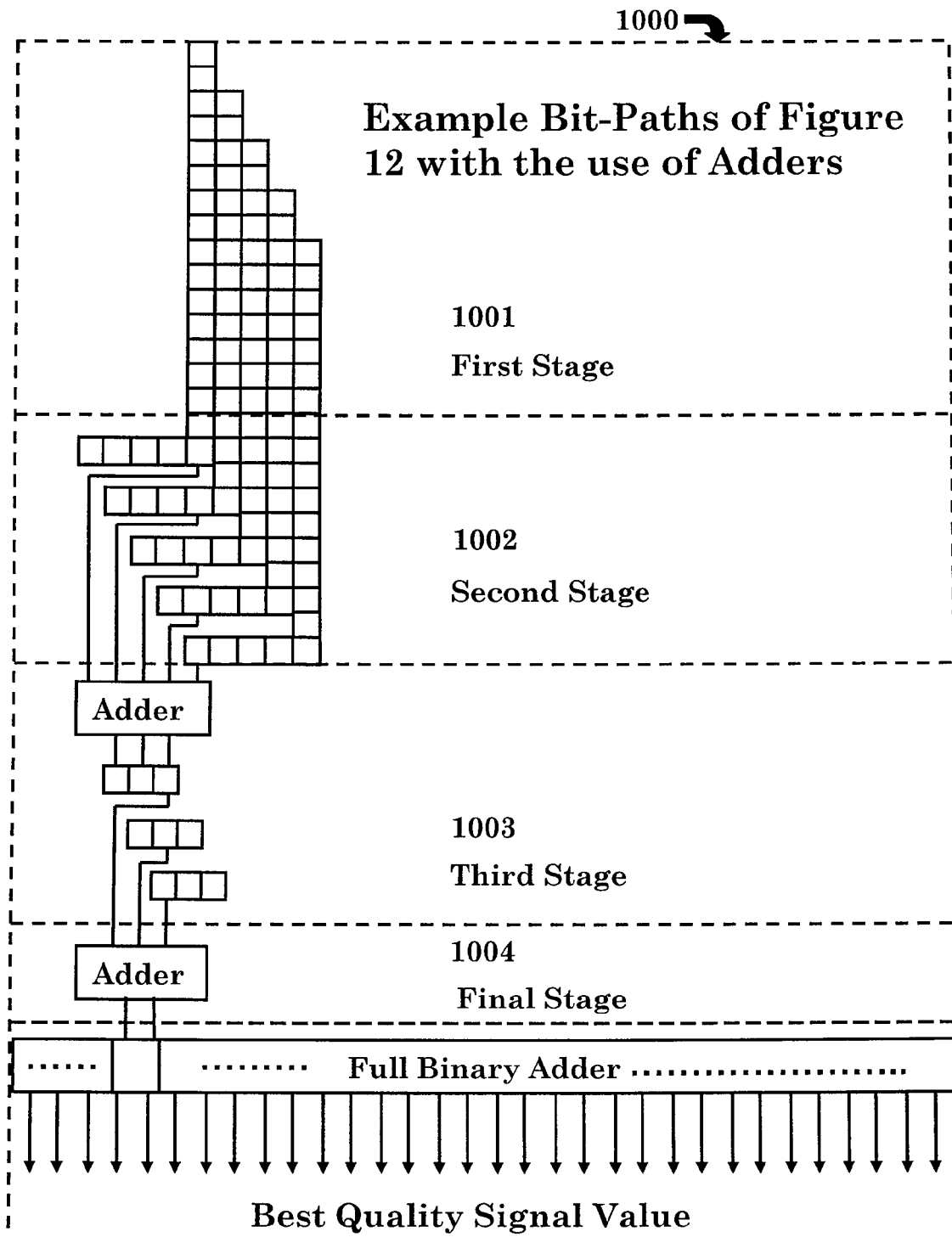
FIG. 13 illustrates the processing of arithmetic averaging using adders, instead of a counter, in accordance with an embodiment of the invention, wherein an architectural slice demonstrates the bit-paths and the inclusion of the adders in three phases of the bit paths.

Reference is now made to FIG. 13, which illustrates an another alternative embodiment that increases the efficiency of the parallel arithmetic structures by inserting logic adders and registers in place of the counters and registers in the arithmetic architectural structures 980 shown in FIG. 12. The parallel computer architecture represented by the structure of FIG. 12 is organized and structured with optimum parallel bit-paths that optimize the parallel execution from when the individual signal values enter the input register 1001 in the architectural structure 1000.

As shown earlier in 300 of FIG. 3, 400 and 401 of FIG. 4, 501 and 502 of FIG. 5, 601 and 602 of FIG. 6, and 952, 953, and 954 of FIG. 10, the total arithmetic summation and averaging can be accomplished by counting the "1s" in the successive columns and placing the binary sums in respective counter registers until the final count is accomplished by the parallel binary adder. The elements and components 980 for the architecture of FIG. 12 include stages of column registers 981, 982, 983, and 984 (see also FIGS. 3-5 of application Ser. No. 11/624,211), counters and a final parallel adder stage 986 that performs the binary addition for the final value of the signal-value average.

The embodiment of FIG. 13 includes binary adders in the third 1003, fourth 1004 and final stages of the architectural structures of FIG. 13. The logic adders of the third stage 1003 of 1000 have five binary inputs 1001 and 1002 that are summed by the adder 1003 into three outputs. These three outputs form the inputs to a three-input adder 1003 of the final stage and would produce the two binary bits for the full binary adder. The full binary adder consists of an ordinary, two-input, binary adder that would produce the final average signal value in binary form. This is shown in FIG. 10 as 952 and 953, and in more detail in FIG. 13.

The parallel hardware structure 1000 of FIG. 13 shows the basic structure and bit-flow as the arithmetic is executed to realize the average signal value, which is to be available at the output of the full binary adder. The structure 1000 is repeated to form and realize the complete architecture with the inherent parallelism of the architectural structure created by the use of like "slices" of the overall architecture as shown in FIG. 13.

It should be appreciated that described herein is an integrated circuit that efficiently and periodically averages signal values taken at an accelerated frequency, measures the signal average using coefficient polynomial arithmetic to determine the values in ordinary binary form in preparation for immediate transmission. Highly efficient averaging of consecutive signal-values, periodically, produces higher quality output signals in terms of accuracy and smoothness, which adds considerably to the overall effective quality of the reconstructed signal.

Also described herein is an integrated circuit that efficiently and periodically averages signal values taken at an accelerated frequency, measures the signal average using coefficient polynomial arithmetic, and, prepares the average signal in coefficient polynomials for transmission. Coefficient polynomial form is then used for transmission and converted to ordinary binary following transmission. Highly efficient averaging of consecutive signal-values, periodically, produces higher quality output signals in terms of accuracy and smoothness, which adds considerably to the overall effective quality of the reconstructed signal.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. An averaging circuit comprising:
   a plurality of cell arrays, each cell array comprising a plurality of cells, wherein each cell is configured to hold a single bit value, and wherein each cell array is configured to shift bit values from an input cell through the plurality of cells in the array to an output cell;
   a plurality of counters, wherein one of the plurality of counters is coupled to the output cell of each cell array and each counter has an input a plurality of outputs; and
   a plurality of logic circuits disposed in one-to-one correspondence to the plurality of counters, such that each of the plurality of counters has a single corresponding logic circuit, wherein each logic circuit has inputs that receive the plurality of outputs of the corresponding counter and generates an output of a single bit position having a value that is based on the values of its inputs.

2. The averaging circuit of claim 1, wherein a number of the plurality of cell arrays is a power of 2.

3. The averaging circuit of claim 1, wherein a number of the plurality of cells in each array is a power of 2.

4. The averaging circuit of claim 1, wherein each counter and corresponding logic circuit are configured to generate an output that is representative of a statistical average of the plurality of bit values in the plurality of cells of a corresponding cell array.

5. The averaging circuit of claim 1, wherein each counter and corresponding logic circuit are configured to generate an output that is representative of an arithmetic average of the plurality of bit values in the plurality of cells of a corresponding cell array.

6. The averaging circuit of claim 1, wherein each counter and corresponding logic circuit are configured to generate an output that has a logic value 1 if the number of bit values in the plurality of cells of a corresponding cell array exceeds a predetermined number.

7. An averaging circuit comprising:
   a cell array laid out to have m columns and n rows, with each cell configured to hold a single bit value, wherein n and m are integer numbers;
   logic associated with each of the m columns to average n samples that are clocked into the n rows of each of the m column, the logic comprising:
   a first-level counter configured to generate a plurality of output bits representative of a summation or count of the n bit values in the cell rows of a corresponding cell column;
   a second-level logic circuit coupled to the output bits of the first-level counter and configured to generate a plurality of output bits based on the output bits of the first-level counter, wherein the number of output bits of the second-level counter is fewer than the number of output bits of the first-level counter; and
   a full adder stage coupled to the output bits of the second-level logic circuit and configured to complete an arithmetic average of all cell values in the n rows of the corresponding column.

8. The averaging circuit of claim 7, wherein n is 16, the first-level counter generates five output bits, and the second-level logic circuit generates three output bits.

9. An averaging circuit comprising:
   a cell array laid out to have m columns and n rows, with each cell configured to hold a single bit value, wherein n and m are integer numbers;
   a plurality of counters, wherein a first-level counter is associated with each of the m columns to generate a plurality of output bits representative of a summation or count of the n bit values in the cell rows of a corresponding cell column;
   a second-level circuit comprising second-level adders having a plurality of inputs, with each input being coupled to a bit position of a distinct one of the first-level counters, the second-level adders having a plurality of output bits having values based on the output bits of the first-level counters, wherein the number of output bits of the second-level adders is fewer than the number of output bits of the first-level counters; and
   a third level circuit comprising third-level adders having a plurality of inputs, with each input being coupled to an output of a second-level adder; and
   a binary adder having two inputs coupled to outputs of the third-level adders.

* * * * *